(12) United States Patent
Kim

(10) Patent No.: US 7,785,967 B2
(45) Date of Patent: Aug. 31, 2010

(54) METHOD FOR MANUFACTURING A SEMICONDUCTOR DEVICE

(75) Inventor: Jung Sam Kim, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 33 days.

(21) Appl. No.: 11/819,853

(22) Filed: Jun. 29, 2007

(65) Prior Publication Data

US 2008/0087948 A1    Apr. 17, 2008

(30) Foreign Application Priority Data

Oct. 16, 2006  (KR) .................. 10-2006-0100349

(51) Int. Cl.
*H01L 21/336* (2006.01)
(52) U.S. Cl. ................. 438/270; 438/589; 257/330; 257/E21.429
(58) Field of Classification Search ............. 438/270, 438/589; 257/330, E21.429
See application file for complete search history.

(56) References Cited

U.S. PATENT DOCUMENTS

| 6,476,444 | B1 | 11/2002 | Min | |
|---|---|---|---|---|
| 7,507,651 | B2* | 3/2009 | Cho et al. | 438/585 |
| 2006/0113590 | A1* | 6/2006 | Kim et al. | 257/330 |
| 2006/0237817 | A1* | 10/2006 | Park | 257/500 |
| 2007/0042583 | A1* | 2/2007 | Jang et al. | 438/585 |
| 2007/0161172 | A1* | 7/2007 | Lin | 438/197 |

FOREIGN PATENT DOCUMENTS

| JP | 09-199726 | 7/1997 |
|---|---|---|
| KR | 10-2006-0026262 A | 3/2006 |

OTHER PUBLICATIONS

Office Action issued from Chinese Intellectual Property Office on Apr. 10, 2009 with an English Translation.

* cited by examiner

*Primary Examiner*—Steven J Fulk
(74) *Attorney, Agent, or Firm*—IP & T Law Firm PLC

(57) ABSTRACT

A semiconductor device includes a semiconductor substrate including an active region and a gate region, and a gate channel formed in a portion of the active region that overlaps the gate region. The gate channel includes a recessed multi-bulb structure.

15 Claims, 12 Drawing Sheets

METHOD FOR MANUFACTURING A SEMICONDUCTOR DEVICE

CROSS-REFERENCE TO RELATED APPLICATIONS

The present application claims the benefit of priority to Korean patent application number 10-2006-0100349, filed on Oct. 16, 2006, the entire contents of which are incorporated herein by reference.

BACKGROUND

The present invention generally relates to a semiconductor device. More particularly, the present invention relates to a semiconductor device comprising a recess transistor and a method for manufacturing the same.

Due to the high integration levels required by semiconductor devices, a process margin for forming an active region and a device isolation structure has been decreased. As a critical dimension ("CD") of a gate becomes smaller, a channel length is reduced, thereby resulting in a short channel effect ("SCE"), which degrades the electrical properties of the semiconductor devices. The short channel effect degrades a refresh property of the gate. In order to prevent the short channel effect, a recess gate may be used. The recess gate is obtained by etching a portion of a semiconductor substrate, so as to enlarge a contact area between the active region and the gate, thereby increasing a gate channel length.

FIG. 1 is a top view illustrating a conventional semiconductor device. An active region 20 and a device isolation structure 30 are formed on a semiconductor substrate 10. A recess region 60 is formed by etching a portion of active region 20 that overlaps a gate region 70a. A gate 70 is formed in recess region 60. Because gate 70 is formed in recess region 60, gate 70 is often referred to as a recess gate.

FIG. 2 is a cross-sectional view illustrating the semiconductor device taken along line A-A' of FIG. 1. As shown in FIG. 2, gate 70 is formed in recess region 60. Because gate 70 is formed in recess region 60 obtained by etching active region 20, a channel length of gate 70 is increased.

However, as a semiconductor device becomes smaller, there is a limit in using recess region 60 to increase the channel length of gate 70. A process margin for forming a landing plug contact region by recess region 60 is reduced. As a result, in order to secure the channel length to a given value, it is required to decrease a width of recess region 60 and to increase a depth of recess region 60, so as to comply with the reduced process margin.

SUMMARY

Embodiments consistent with the present invention relates to a semiconductor device comprising a recess transistor including a recess gate, the channel length of which is increased. In one embodiment, the recess gate further includes a recessed multi-bulb structure to increase a length in the bottom of the recess.

In one embodiment, a semiconductor device comprises a gate channel with a recessed multi-bulb structure.

In another embodiment, a method for forming a semiconductor device comprises: forming a plurality of first recesses by selectively etching a gate region on a semiconductor substrate; and forming a second recess by etching a lower part of at least two of the first recesses to form a gate channel including a recessed multi-bulb structure.

In another embodiment, a method for forming a semiconductor device comprises: forming a device isolation structure in a semiconductor substrate to define an active region; forming a first hard mask pattern including an exposed region having a plurality of slits over the semiconductor substrate to expose a portion of the active region that overlaps a gate region; forming a first recess by selectively etching the exposed portion of the active region using the first hard mask pattern as an etching mask; removing the first hard mask pattern to expose the active region including the first recess; forming an oxide spacer over sidewalls of the first recess; forming a second recess by selectively etching a lower part of the first recess; forming a spin-on-dielectric film to fill the first recess and the second recess; forming a second hard mask pattern over the semiconductor substrate to expose the portion of the active region that overlaps the gate region; etching the active region remained in the first recess by using the second hard mask pattern as an etching mask; removing the second hard mask pattern; forming a gate channel by removing the spin-on-dielectric film filled in the first recess and the second recess; and forming a gate in the gate channel.

DETAILED DESCRIPTION

Figure 1:
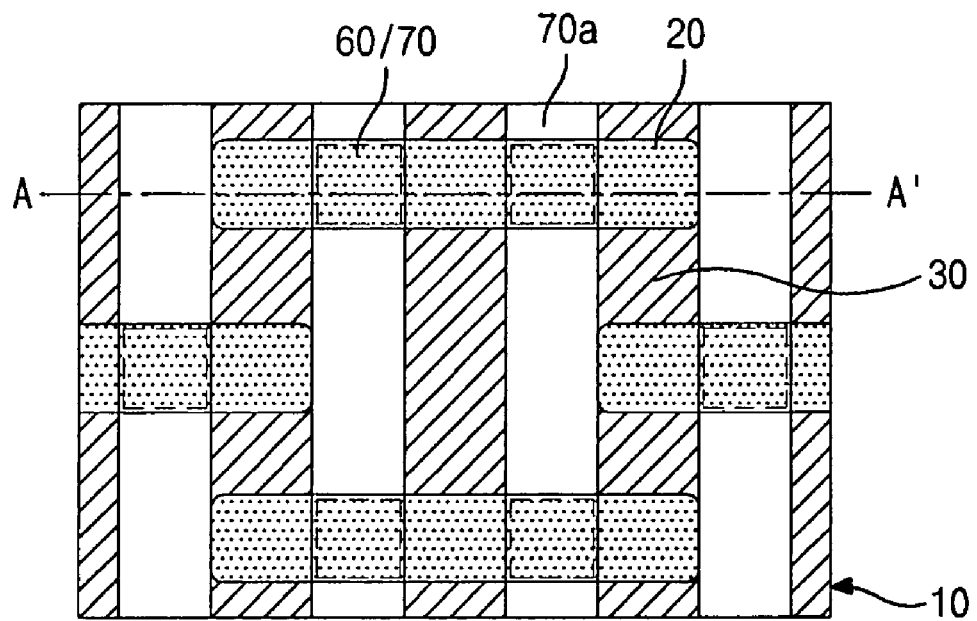
FIG. 1 is a top view illustrating a conventional semiconductor device.
Figure 2:
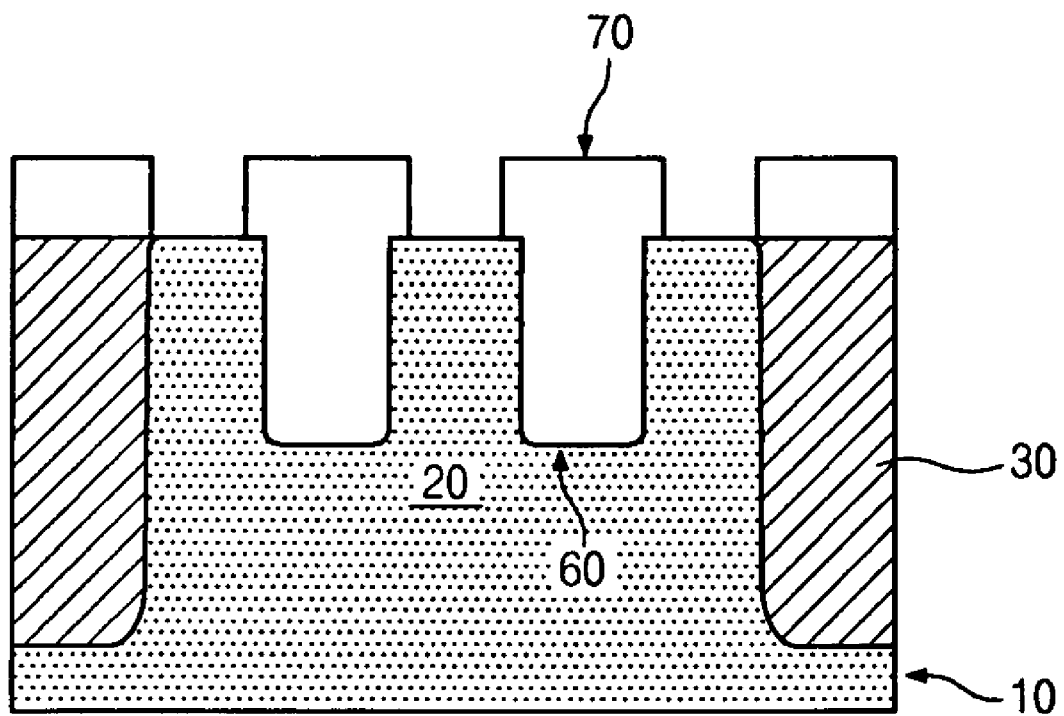
FIG. 2 is a cross-sectional view illustrating the conventional semiconductor device shown in FIG. 1.
Figure 3:
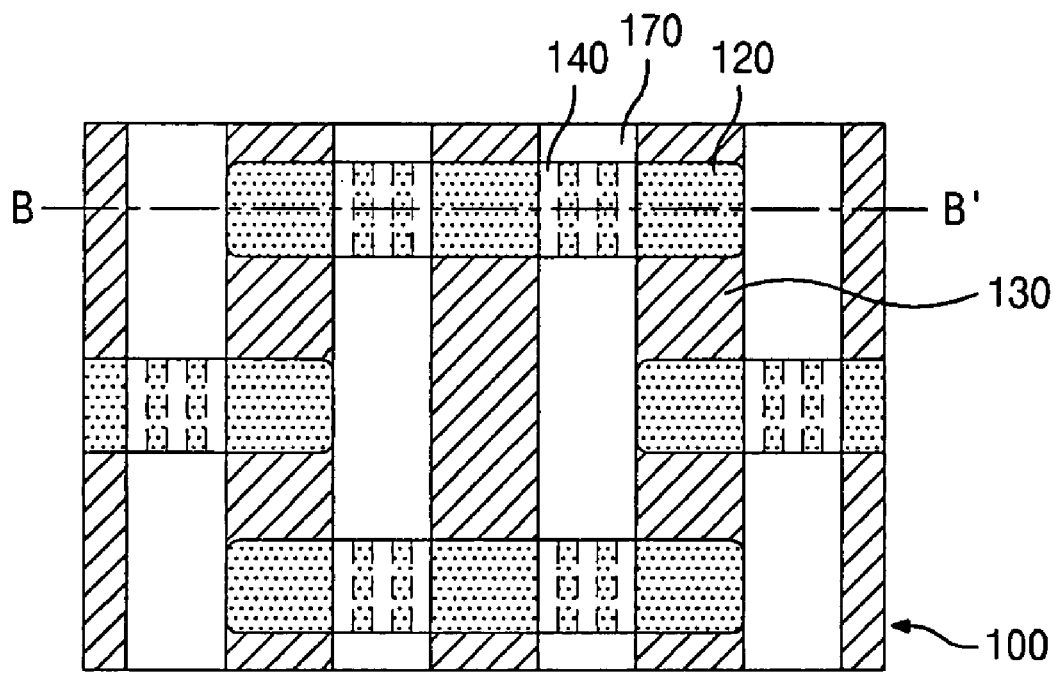
FIG. 3 is a top view illustrating a semiconductor device according to an embodiment consistent with the present invention.

FIG. 3 is a top view illustrating a semiconductor device according to an embodiment consistent with the present invention. A device isolation structure 130 that defines an active region 120 is formed on a semiconductor substrate 100. A recess region is formed in semiconductor substrate 100 in a portion of active region 120 that overlaps a gate 170. The recess region includes a first recess 140 having three slits. The three slits of first recess 140 are formed parallel to a longitudinal direction of gate 170. As described below, a spherical recess is formed in semiconductor substrate 100 at the bottoms of each of the three slits formed in first recess 140.

Figure 4A:
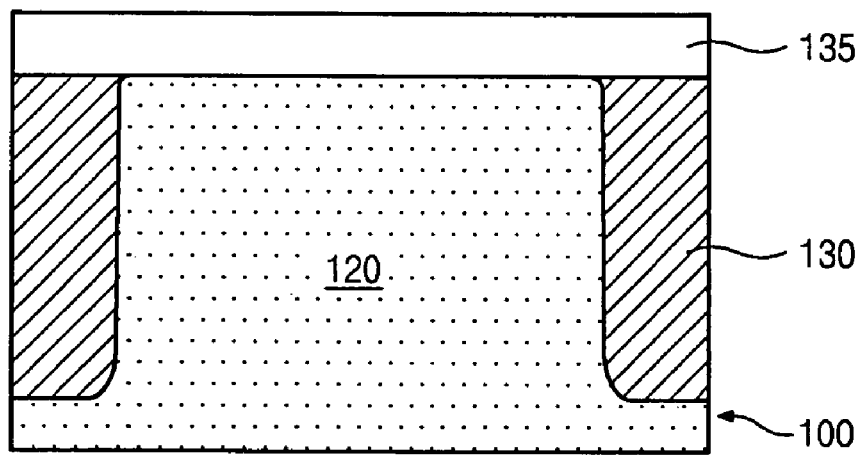
FIGS. 4a to 4q are cross-sectional views illustrating a method for manufacturing a semiconductor device according to an embodiment consistent with the present invention.
Figure 4B:
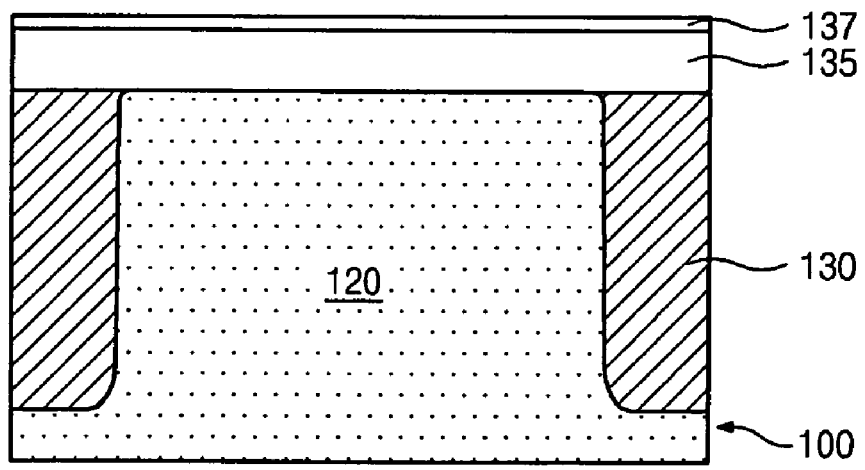
Figure 4C:
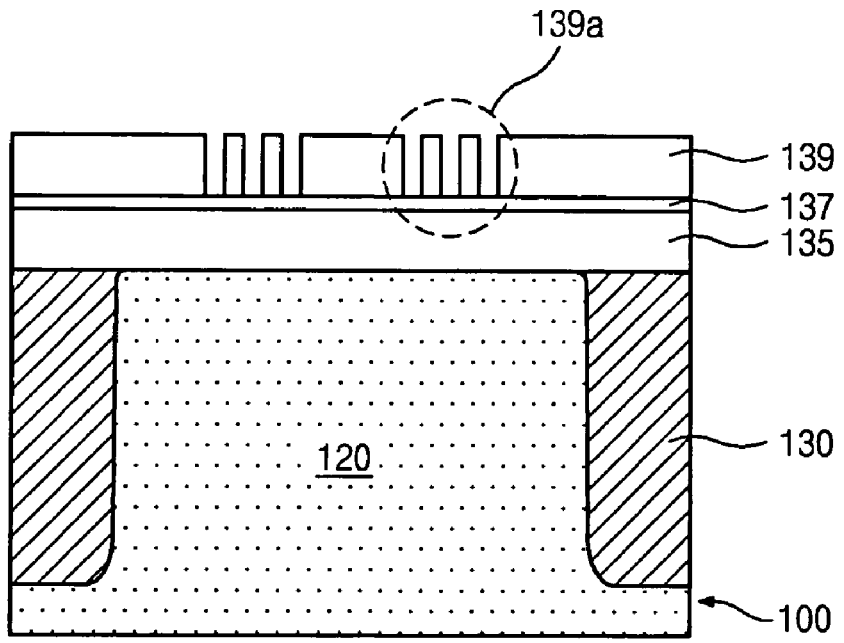
Figure 4D:
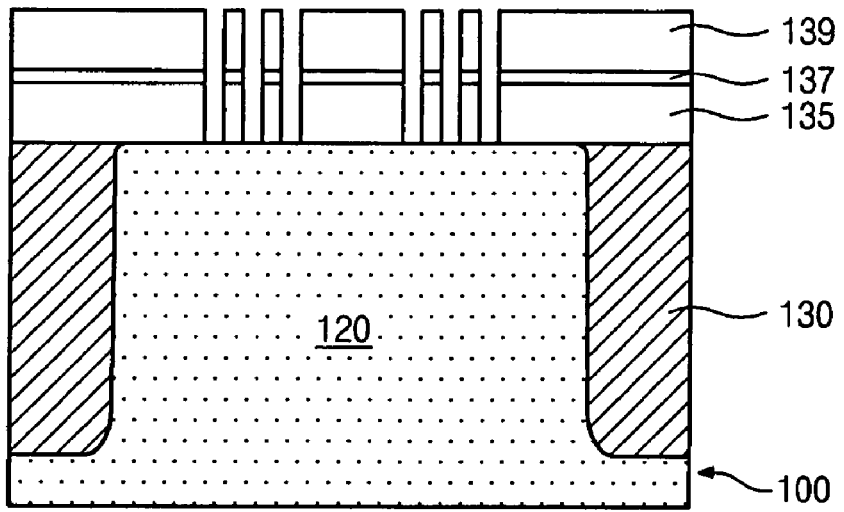
Figure 4E:
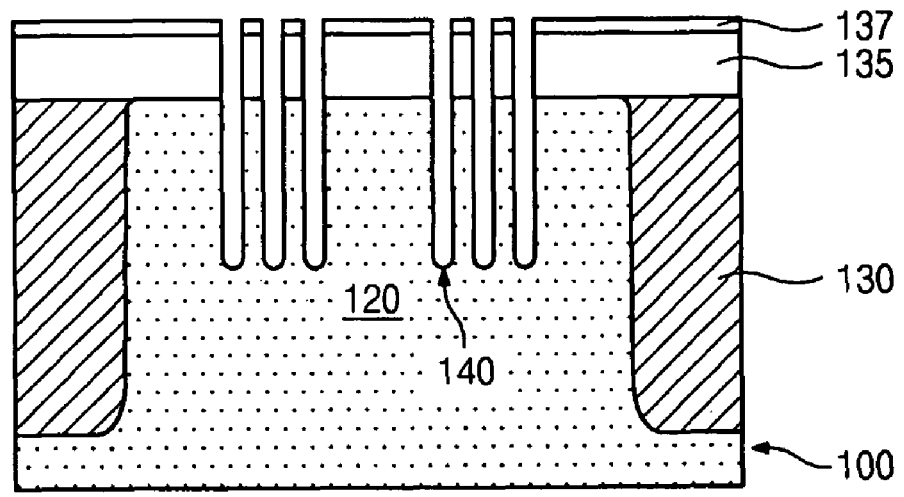
Figure 4F:
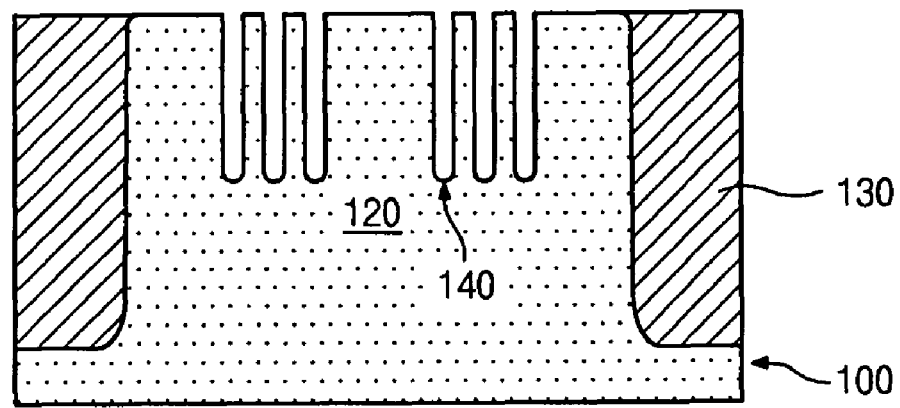
Figure 4G:
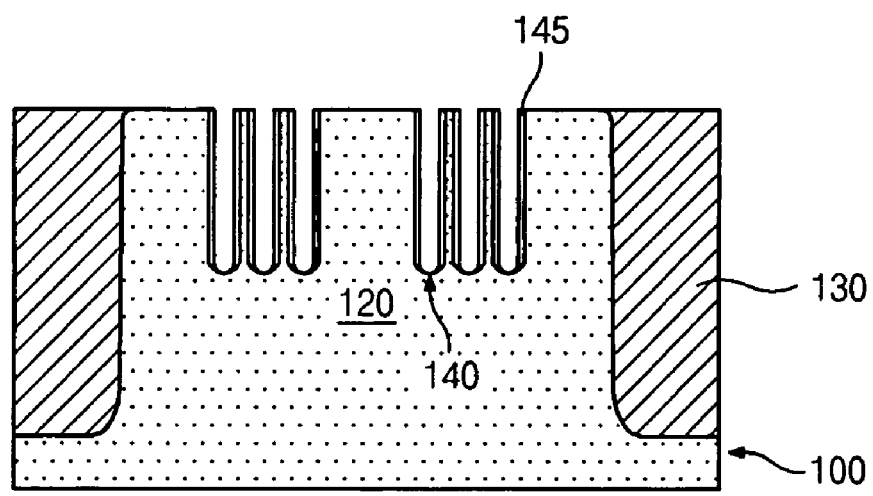
Figure 4H:
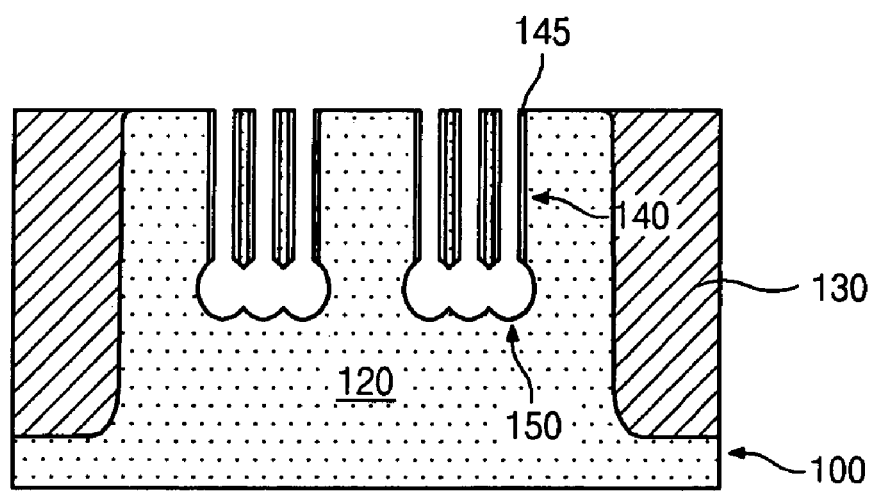
Figure 4I:
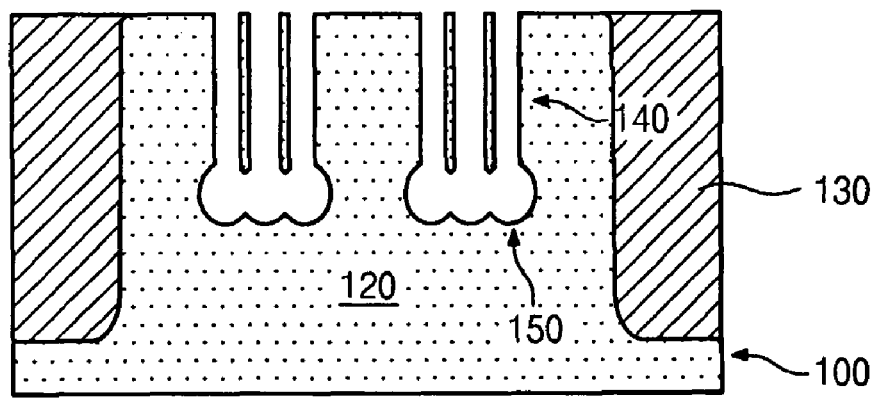
Figure 4J:
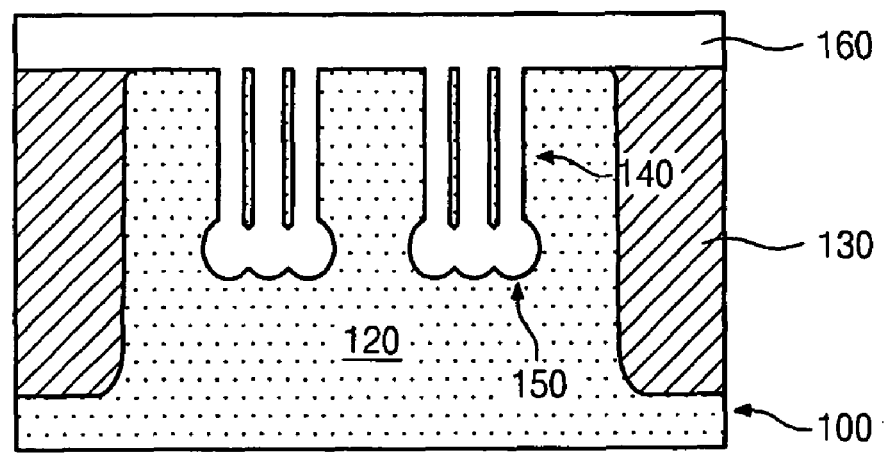
Figure 4K:
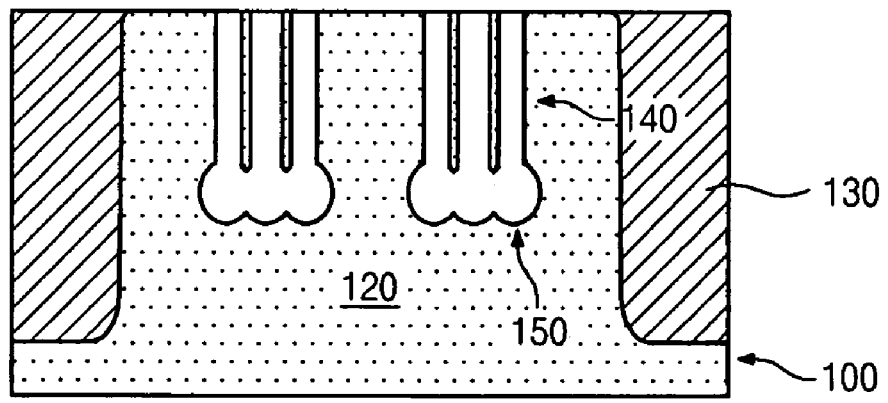
Figure 4L:
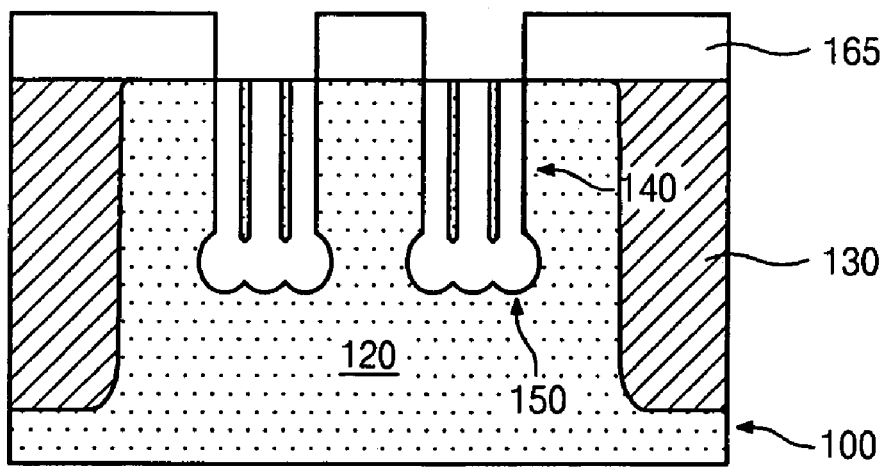
Figure 4M:
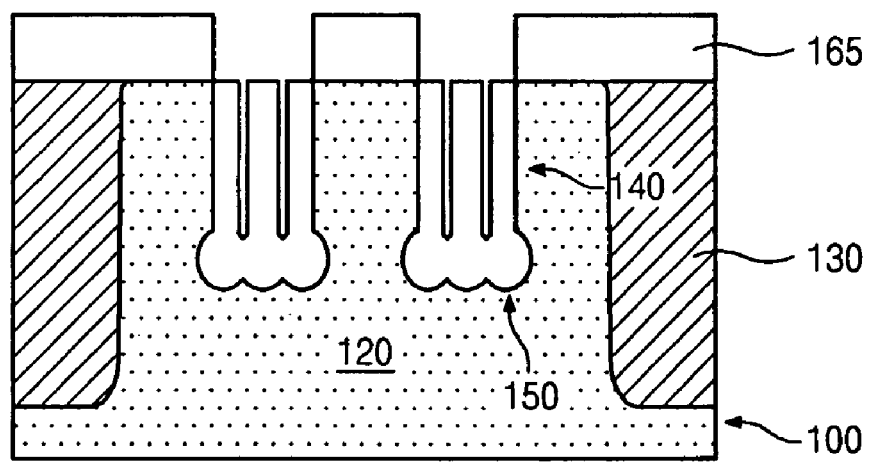
Figure 4N:
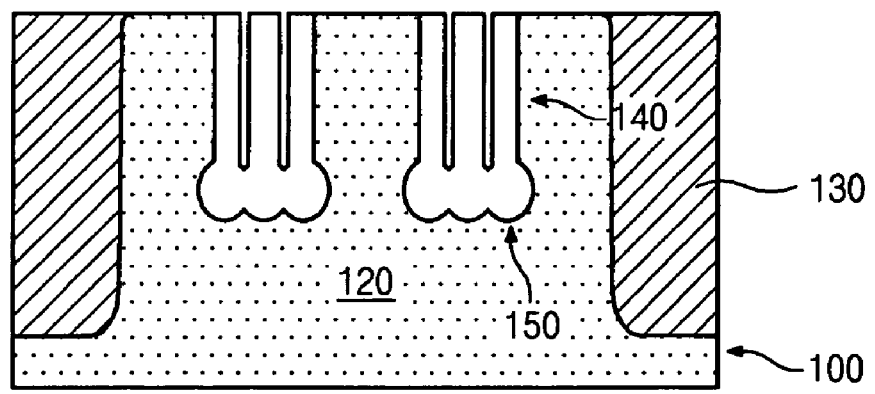
Figure 4O:
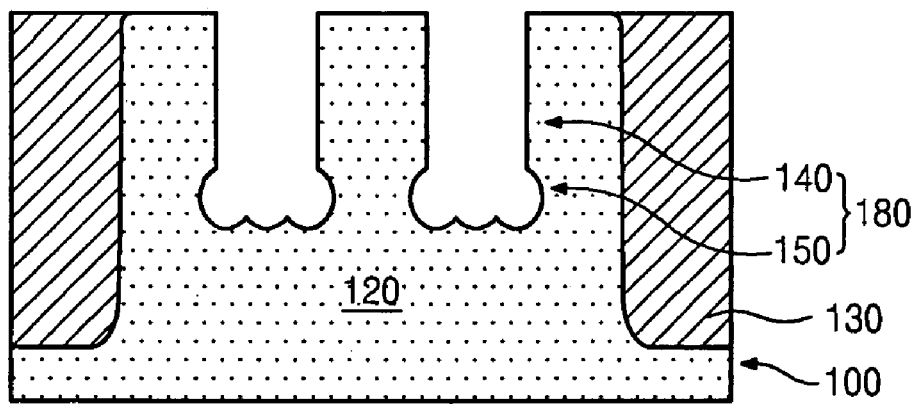
Figure 4P:
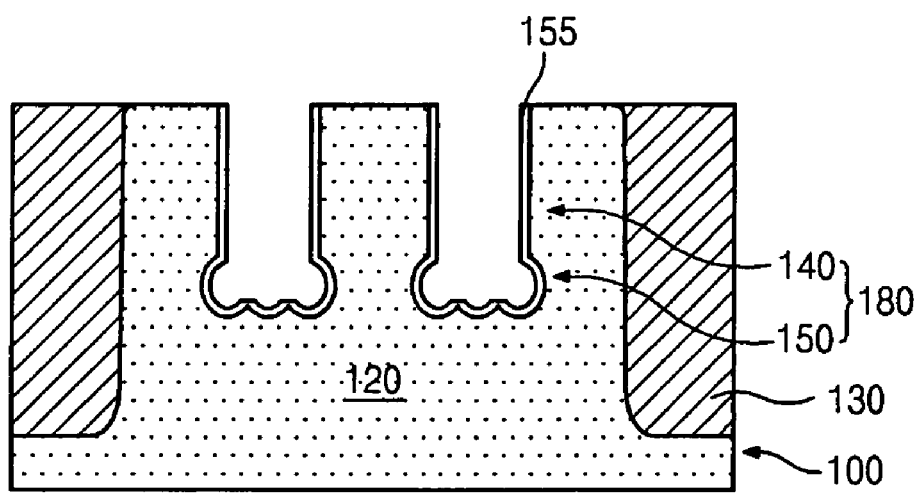
Figure 4Q:
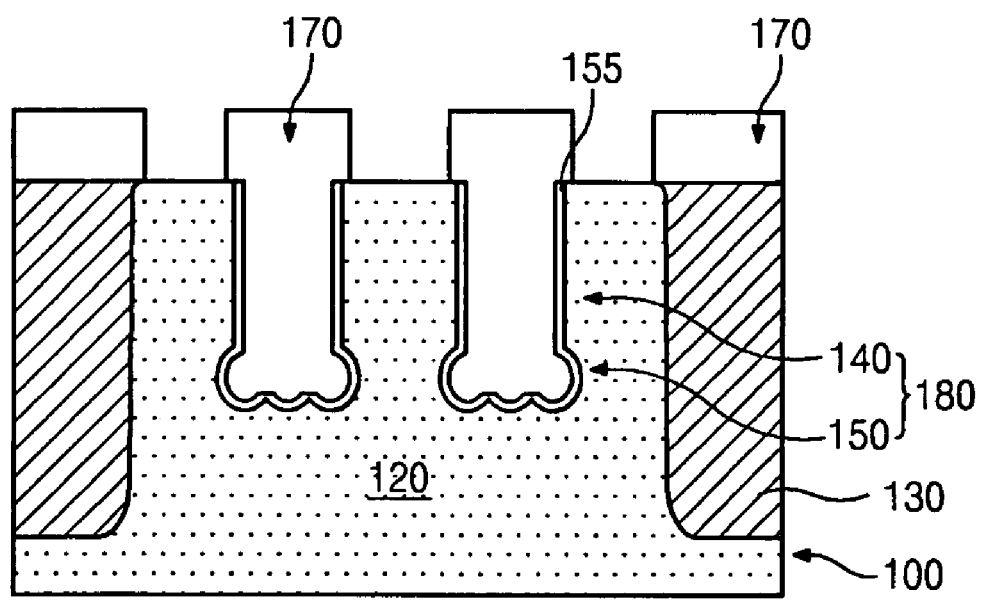

FIGS. 4a to 4q are cross-sectional views illustrating a method for manufacturing a semiconductor device according to an embodiment consistent with the present invention. FIGS. 4a to 4q are cross-sectional views taken along line B-B' of FIG. 3. As shown in FIG. 4a, device isolation structure 130 that defines active region 120 is formed in semiconductor substrate 100. Device isolation structure 130 may be formed by a shallow trench isolation ("STI") process. A first hard mask layer 135 is formed over semiconductor substrate 100. First hard mask layer 135 may include a carbon layer in order to prevent a fine pattern having a slit formed in first hard mask layer 135 from being damaged in an etching process for forming a recess region.

Referring to FIG. 4b, a silicon oxynitride (SiON) film 137 is formed over first hard mask layer 135, SiOn film 137 having a thickness in a range of about 300 Å to 500 Å. SiON film 137 may compensate a margin of a photoresist pattern in a subsequent process, and may control scattered reflection in a photolithography process.

Referring to FIGS. 4c and 4d, a first photoresist pattern 139 is formed over SiON film 137. First photoresist pattern 139 defines an exposed region 139a having three slits above active region 120 that overlaps gate 170 shown in FIG. 3. SiON film 137 and first hard mask layer 135 are then etched to expose active region 120 using first photoresist pattern 139 as an etching mask.

Referring to FIG. 4e, first photoresist pattern 139 is then removed. Semiconductor substrate 100 is anisotropic-etched to form a first recess 140 using SiON film 137 and first hard mask pattern 135 as an etching mask. In one embodiment, first recess 140 at this stage may include three recesses. It is to be understood that first recess 140 may include any number of recesses. A cleaning process may be performed over semiconductor substrate 100 before and after the anisotropic-etching process. The cleaning process may be performed using a $H_2SO_4$ solution (a ratio of sulfuric acid to water may be about 4:1) at a temperature in a range of about 100° C. to 140° C. The cleaning process removes organics, particles, contamination materials, and natural oxide films generated from the etching process that forms first recess 140.

Referring to FIGS. 4f and 4g, SiON film 137 and first hard mask layer 135 are removed. An oxide film may be formed over semiconductor substrate 100. For example, as illustrated in FIG. 4g, after forming an oxide film within first recess 140, an etch-back process may be performed over oxide film to form an oxide spacer 145 on sidewalls of first recess 140.

Referring to FIGS. 4h and 4i, a lower portion of first recess 140 is etched via a dry isotropic etching method using oxide spacer 145 as an etch mask to form a second spherical recess 150. In one embodiment, second spherical recess 150 may include three spherical recesses coupled with each other. It is to be understood that second spherical recess 150 may include any number of spherical recesses. A total depth of first recess 140 and second recess 150 may be in a range of about 1,000 Å to 1,200 Å. Oxide spacer 145 is then removed, resulting in the structure illustrated in FIG. 4i.

Referring to FIG. 4j, a spin-on-dielectric ("SOD") film 160 is formed over semiconductor substrate 100 to fill first recess 140 and second spherical recess 150. SOD film 160 that fills first recess 140 and second recess 150 has good dielectric and filling properties.

Referring to FIG. 4k, a chemical mechanical polishing (CMP) process may be performed to etch SOD film 160, and to expose active region 120 and device isolation structure 130. SOD film 160 formed over semiconductor substrate 100 is thus removed by the CMP process. SOD film 160 formed over semiconductor substrate 100 may also be removed by a wet etching method.

Referring to FIG. 4l, a second hard mask pattern 165 that exposes first recess 140 is formed over semiconductor substrate 100. Second hard mask pattern 165 may include a carbon layer. Second hard mask pattern 165 may be formed by the same method for forming first hard mask pattern 135.

Referring to FIG. 4m to 4p, active region 120 remained in first recess 140 is removed using second hard mask pattern 165 as a mask. Second hard mask pattern 165 is then removed. SOD film 160 filled in first recess 140 and second recess 150 is removed to form a recess channel structure (e.g. gate channel with a recessed multi-bulb structure) 180 including first recess 140 and second spherical recess 150. A gate oxide film 155 is formed on surfaces of recess channel structure 180 and semiconductor substrate 100. It is to be understood that the recessed multi-bulb structure may include at least two bulb recesses.

Referring to FIG. 4q, a gate polysilicon layer, a metal layer, and a gate hard mask layer are sequentially formed over semiconductor substrate 100. The gate hard mask layer, the metal layer, the gate polysilicon layer, and gate oxide film 155 are patterned using a gate mask to form a recess gate 170.

As described above, in a semiconductor device and a method for manufacturing the same according to an embodiment consistent with the present invention, first recess 140 and second spherical recess 150 are formed in active region 120 to obtain gate 170 with an increased channel length. Therefore, the semiconductor device including gate 170 can improve the electrical properties of the semiconductor device.

The above embodiments consistent with the present invention are illustrative and not limitative. Various alternatives and equivalents are possible. The invention is not limited by the types of deposition, etching, polishing, and patterning steps described herein. Nor is the invention limited to any specific types of semiconductor devices. For example, the present invention may be implemented in a dynamic random access memory (DRAM) device or in a non-volatile memory device. Other additions, subtractions, or modifications are obvious in view of the present disclosure and are intended to fall within the scope of the appended claims.

What is claimed is:

1. A method for forming a semiconductor device, the method comprising:
    forming a plurality of first recesses in a gate region of an active region by selectively etching the gate regions;
    forming a spacer over sidewalls of the first recesses;
    forming a second recess by etching a lower part of each of the first recesses to form a recessed multi-blub structure;
    forming a dielectric film to fill the first recesses and the second recess;
    etching the gate region remaining between the first recesses; and
    forming a gate channel by removing the dielectric film filling the first recesses and the second recess.

2. The method of claim 1, further comprising filling a conductive material in the first recesses and the second recess to form a gate electrode.

3. The method of claim 1, wherein forming the first recesses comprises performing a dry anisotropic etching method.

4. The method of claim 1, wherein forming the second recess comprises performing a dry isotropic etching method.

5. The method of claim 1, wherein the recessed multi-bulb structure comprises a plurality of spherical recesses coupled with each other.

6. The method of claim 1, wherein the gate channel is formed to have a depth in a range of about 1,000 Å to 2,000 Å.

7. A method for forming a semiconductor device, the method comprising:
    forming a device isolation structure in a semiconductor substrate to define an active region;
    forming a first hard mask pattern including an exposed region having a plurality of slits over the semiconductor substrate to expose a portion of the active region that overlaps a gate region;
    forming a first recess by selectively etching the exposed portion of the active region using the first hard mask pattern as an etching mask;
    removing the first hard mask pattern to expose the active region including the first recess;
    forming an oxide spacer over sidewalls of the first recess;
    forming a second recess by selectively etching a lower part of the first recess;
    forming a spin-on-dielectric film to fill the first recess and the second recess;

forming a second hard mask pattern over the semiconductor substrate to expose the portion of the active region that overlaps the gate region;

etching the active region remaining in the first recess by using the second hard mask pattern as an etching mask;

removing the second hard mask pattern;

forming a gate channel by removing the spin-on-dielectric film filling the first recess and the second recess; and forming a gate in the gate channel.

8. The method of claim 7, wherein the first hard mask and the second hard mask patterns comprise a carbon layer.

9. The method of claim 7, wherein forming the first hard mask pattern further comprises:

forming a hard mask layer over the semiconductor substrate;

forming a silicon oxynitride film over the hard mask layer;

forming a photoresist pattern over the silicon oxynitride film;

etching the silicon oxynitride film and the hard mask layer by using the photoresist pattern as an etching mask; and removing the photoresist pattern and the silicon oxynitride film.

10. The method of claim 7, wherein forming the first recess comprises performing a dry anisotropic etching method.

11. The method of claim 7, wherein forming the second recess comprises performing a dry isotropic etching method.

12. The method of claim 7, wherein the gate channel comprises a recessed multi-bulb structure.

13. The method of claim 12, wherein the recessed multi-bulb structure comprises a plurality of spherical recesses coupled with each other.

14. The method of claim 7, wherein the gate channel including the first recess and the second recess is formed to have a thickness in a range of about 1,000Å to 2,000 Å.

15. A method for forming a semiconductor device, the method comprising:

forming at least two first recesses in a gate region of an active region;

forming a spacer over sidewalls of the first recesses;

forming at least two second recesses respectively at lower portions of the at least two first recesses, the at least two second recesses being coupled with each other to form a multi-bulb structure;

forming a dielectric film to fill the first recesses and the second recesses;

etching the gate region remaining between the first recesses; and forming a gate channel by removing the dielectric film filling the first recesses and the second recesses.

* * * * *